United States Patent [19]

Gibson et al.

[11] Patent Number: 4,574,308

[45] Date of Patent: Mar. 4, 1986

[54] FM VIDEO RECEIVER

[75] Inventors: Galen R. Gibson, Bartlesville; Ralph E. Anstaett, Jr., Tulsa, both of Okla.

[73] Assignee: Dell-Star Corporation, Tulsa, Okla.

[21] Appl. No.: 602,475

[22] Filed: Apr. 20, 1984

[51] Int. Cl.$^4$ ............................................. H04N 5/44
[52] U.S. Cl. ................................ 358/188; 358/191.1; 358/197
[58] Field of Search .................... 358/188, 186, 191.1, 358/193.1, 195.1, 197, 198, 114; 455/182, 192, 164, 234, 142, 26, 205; 375/1, 2.1

[56] References Cited

U.S. PATENT DOCUMENTS

| 4,255,810 | 3/1981 | Solomon | 375/1 |
| 4,467,360 | 8/1984 | Fosse | 358/197 |
| 4,470,071 | 9/1984 | Rindal | 358/197 |

Primary Examiner—Tommy P. Chin

Attorney, Agent, or Firm—Fleit, Jacobson, Cohn & Price

[57] ABSTRACT

An FM video receiver includes a UHF tuner coupled to an intermediate frequency amplifier. The output of the IF amplifier is coupled to a video IF amplifier and detector. The latter component is tuned to the video portion of the FM video composite signal, and hence limits and detects the intelligence carried by that signal. A video inverter and video driver process the signal further and applies an amplitude modulated line level video signal at the receiver's output. An audio IF amplifier and discriminator are coupled to the output of the video IF amplifier and detector. Since the video IF amplifier essentially passes through the audio portion of the FM video composite signal, the audio IF amplifier limits and detects that audio signal. An automatic gain control network and an automatic frequency control network provide feedback to the tuner.

2 Claims, 8 Drawing Figures

FM VIDEO RECEIVER

BACKGROUND OF THE INVENTION

This invention relates generally to a receiver capable of detecting a frequency modulated (FM) signal, and particularly a receiver capable of demodulating a FM composite video signal.

In certain situations, it is desirable to utilize a communications system which is not susceptible to detection and demodulation by commercially available consumer products. The transmission of composite video signals, those composite signals including both video information and audio information, utilizes an amplitude modulated (AM) video signal with an FM audio signal on the sidebands of the AM signal. Commercially available products, such as television sets coupled to antennas or other sensing devices, receive such AM composite video signals, amplify those received signals, demodulate the AM video signals, separate out the FM audio signals, and present the visual and sound intelligence carried by the signals to the user. In certain situations, it is desirable to transmit a video composite signal which cannot be detected, demodulated and presented on such commercially available, consumer products.

OBJECTIONS OF THE INVENTION

It is an object of the present invention to provide an FM video receiver which detects, demodulates and amplifies a frequency modulated composite video signal.

SUMMARY OF THE INVENTION

In one embodiment of the invention, the FM video receiver includes a tuner which receives a plurality of frequency modulated composite video signals via an antenna. The tuner selects one of the plurality of received FM composite video signals, amplifies that selected signal, and generates an intermediate frequency composite signal. The intermediate frequency composite signal carries the same intelligence as the selected composite video signal. An intermediate frequency amplifier amplifies the intermediate frequency composite signal. The output of the intermediate frequency amplifier is coupled to means for limiting and discriminating the amplified intermediate frequency composite signal. The limiter and discriminator are tuned to the video portion of the amplified intermediate frequency composite signal. This limiter and discriminator generate an amplitude modulated video signal corresponding to the amplitude of the frequency variation of the video portion of the amplified intermediate frequency composite signal. A video driver is coupled to the output of the limiter and discriminator and generates a line level video signal. The FM receiver includes an automatic gain control (AGC) means which provides a feedback signal to the amplifier in the tuner. The receiver also includes an automatic frequency control (AFC) which provides a feedback signal to the tuner for selecting one of the plurality of received FM composite video signals. An audio intermediate frequency amplifier is coupled to the output of the limiter and discriminator. The audio intermediate frequency amplifier separates the audio portion from the amplitude modulated video signal, limits that audio portion, discriminates the same, and amplifies the same to generate an amplitude modulated audio signal corresponding to the amplitude of the frequency variation of the audio portion of the amplified intermediate frequency composite signal.

BRIEF DESCRIPTION OF THE DRAWINGS

The present invention, together with additional objects and advantages thereof, is better understood by the following detailed description, however, the claims appended hereto particularly point out and distinctly claim the invention in which:

DETAILED DESCRIPTION OF THE DRAWINGS

This invention relates generally to a video receiver, and particularly to an FM video receiver capable of detecting, demodulating, and amplifying an FM video composite signal.

Figure 1:
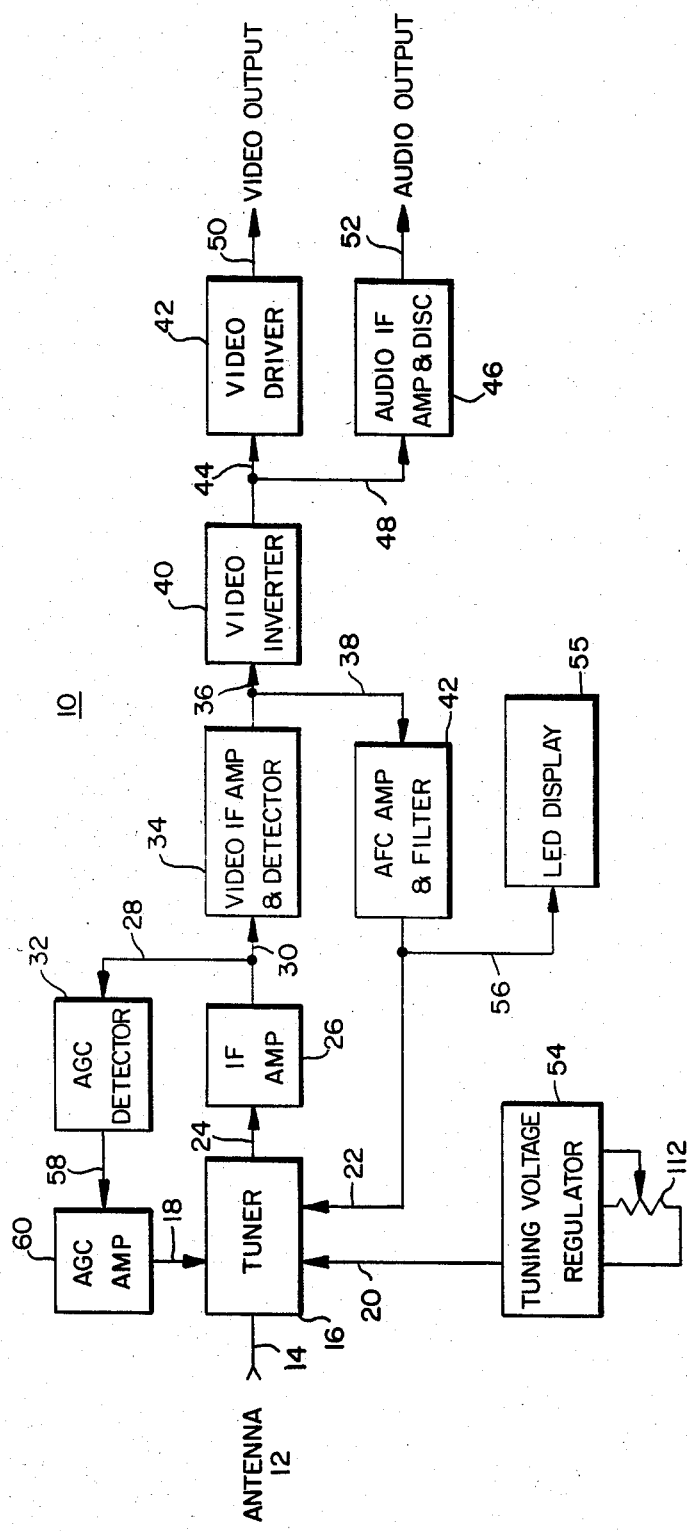
FIG. 1 is a block diagram of the FM video receiver.

FIG. 1 illustrates, in block diagram form, the major components of an FM video receiver 10. Receiver 10 is supplied with a plurality of frequency modulated (FM) composite video signals by antenna 12 via input line 14. An ultra high frequency tuner 16 includes an automatic gain control (AGC) signal input coupled to line 18, a tuning voltage regulator input coupled to line 20, and an automatic frequency control signal input coupled to line 22. Tuner 16 applies an intermediate frequency composite signal on line 24 which couples the tuner to an intermediate frequency amplifier 26. The output of intermediate frequency amplifier 26 is coupled via lines 28 and 30 to automatic gain control (AGC) detector 32 and video intermediate frequency amplifier and detector 34, respectively. The output of video intermediate frequency amplifier and detector 34 is coupled via lines 36 and 38 to video inverter 40 and an automatic frequency control (AFC) amplifier and filter 42, respectively. The output of video inverter 40 is tied to a video driver 42 by line 44. The output of video inverter 40 is also coupled to an audio intermediate frequency amplifier and discriminator 46 by line 48. Video driver 42 applies, at its output, a line level video signal on line 50. The output of audio intermediate frequency amplifier and discriminator 46 is coupled to lead 52 which carries an amplitude modulated audio signal.

Tuner 16 is tied, via line 20, to a tuning voltage regulator 54. Regulator 54 is controlled by the FM receiver operator by variable resistor 112. An LED display 55 is coupled to the output of AFC amplifier and filter 42 by line 56. The output of the AGC detector 32 is coupled to line 58 which, in turn, is coupled to the input of AGC amplifier 60.

Figure 2:
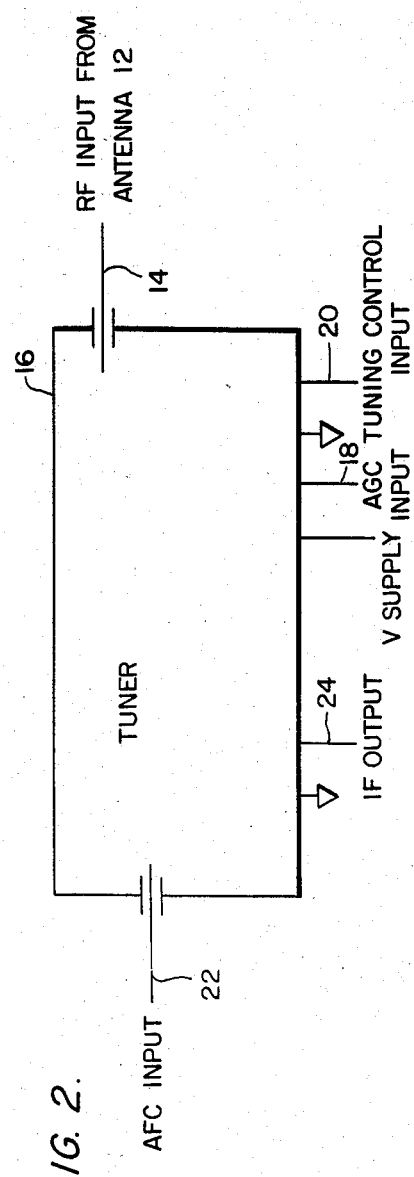
FIG. 2 is a block diagram of the tuner.

FIG. 2 illustrates, in block diagram form, tuner 16. The radio frequency (RF) input from antenna 12 is supplied via line 14 to tuner 16. Antenna 12 supplies a plurality of frequency modulated composite video signals. In one embodiment, a UHF tuner assembly by Mitsumi Electric Company, Ltd., No. UES-A56F, is utilized as tuner 16. With that component, pin 8 is tied to the intermediate frequency output line 24, pin 4 is supplied with a supply voltage, pin 3 is the AGC input and is tied to line 18, pins 2 and 9 are connected to the device's ground, and pin 1 is coupled to line 20 linking tuner 16 to tuning voltage regulator 54. This particular tuner includes a standard 75 ohm unbalanced input. A high gain, tuned antenna, which is vertically or horizontally polarized, and is either omni-directional or highly directional, is utilized as required in a particular situation to supply the radio frequency input to tuner 16. In one embodiment, the "top end" of tuner 16 is adjusted to 950 megahertz. With this particular tuner, the input signal on line 14 should be at least −60 dBm.

Figure 3:
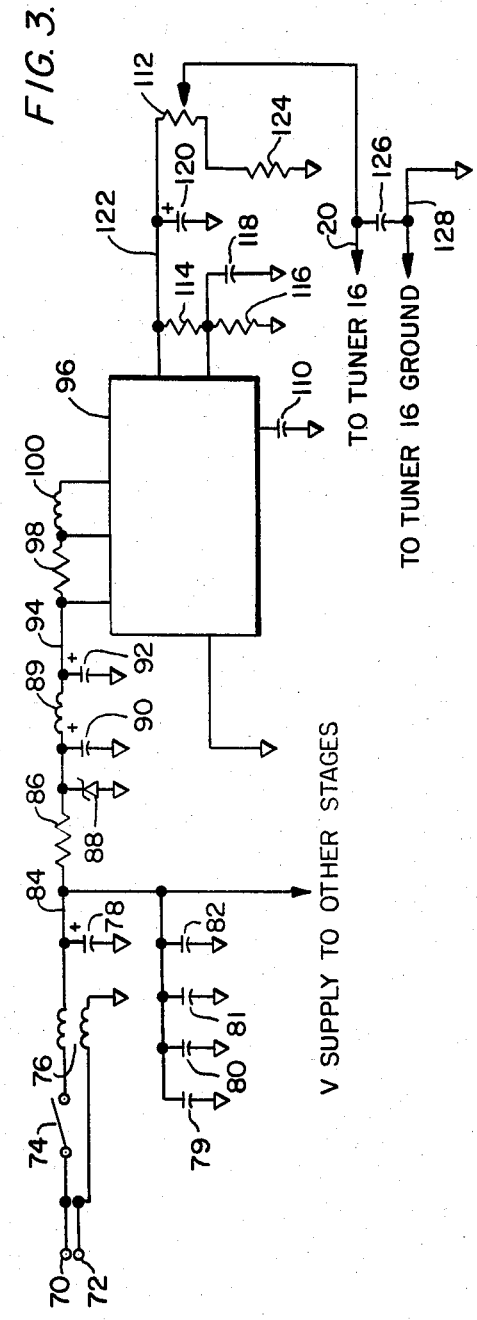
FIG. 3 is a schematic illustrating the tuning voltage regulator.

FIG. 3 illustrates, in schematic form, tuning voltage regulator 54. DC power is applied between a pair of terminals 70 and 72. Switch 74 connects the power supply to the balance of tuning voltage regulator 54. A bifilar inductor 76 prevents a signal from entering or leaving regulator 54 through the power cord designated by terminals 70, 72. Capacitor 78 provides bypass capacitance for a well filtered supply voltage as do capacitors 79, 80, 81 and 82 coupled between a supply line 84 and ground. As used herein, the word "ground" refers to the ground of the entire FM video receiver which may be a "floating ground." Resistor 86 and zener diode 88 preregulate the voltage on line 84. The combination of coil 89, capacitor 90 and capacitor 92 keeps switching noise off of supply line 94. In one embodiment, an integrated circuit chip 96 "steps up" the voltage thereby allowing tuning voltage regulator 54 to provide 32 volts DC to tuner 16. In this embodiment, a DC power of 13.6 volts is input at terminals 70 and 72. Integrated circuit chip 96 is a switching regulator, which, in one embodiment, is a TL497ACN, manufactured by Texas Instruments. With this switching regulator, pin 14 is tied directly to supply line 94 and pin 13 is coupled to line 94 across resistor 98. Pins 7 and 10 are coupled together and coupled to the side of resistor 98 opposite line 94, via coil 100. Resistor 98 provides for "soft starts" while coil 100 provides an appropriate energy storage means for chip 96. Chip 96 is coupled to ground, and, in this particular embodiment, pins 2, 4, 5 and 8 are tied to ground. The frequency of operation of chip 96 is set by capacitor 110 coupled between ground and pin 3 of the particular device.

Variable resistor 112 establishes a voltage which is supplied via line 20 to tuner 16. The voltage level on line 20 establishes the selected frequency from the plurality of FM composite video signal frequencies supplied to tuner 16 by antenna 12. Variable resistor 112 is adjustable by the user of FM video receiver 10. In one embodiment, variable resistor 112 is a 10-turn controller with a turn counter visible to the user of FM video receiver 10. Resistors 114, 116 and capacitor 118 establish a feedback network to control the voltage supplied for variable resistor 112. Capacitor 120 provides a bypass to limit the noise on line 122. Resistor 124 is coupled between one end of variable resistor 112 and ground and sets the minimum frequency tuner 16 is allowed to tune. Capacitor 126 is coupled between line 20 and line 128 to keep noise off of line 20. Line 128 is coupled to ground and is also coupled to the ground pins of tuner 16.

Figure 4:
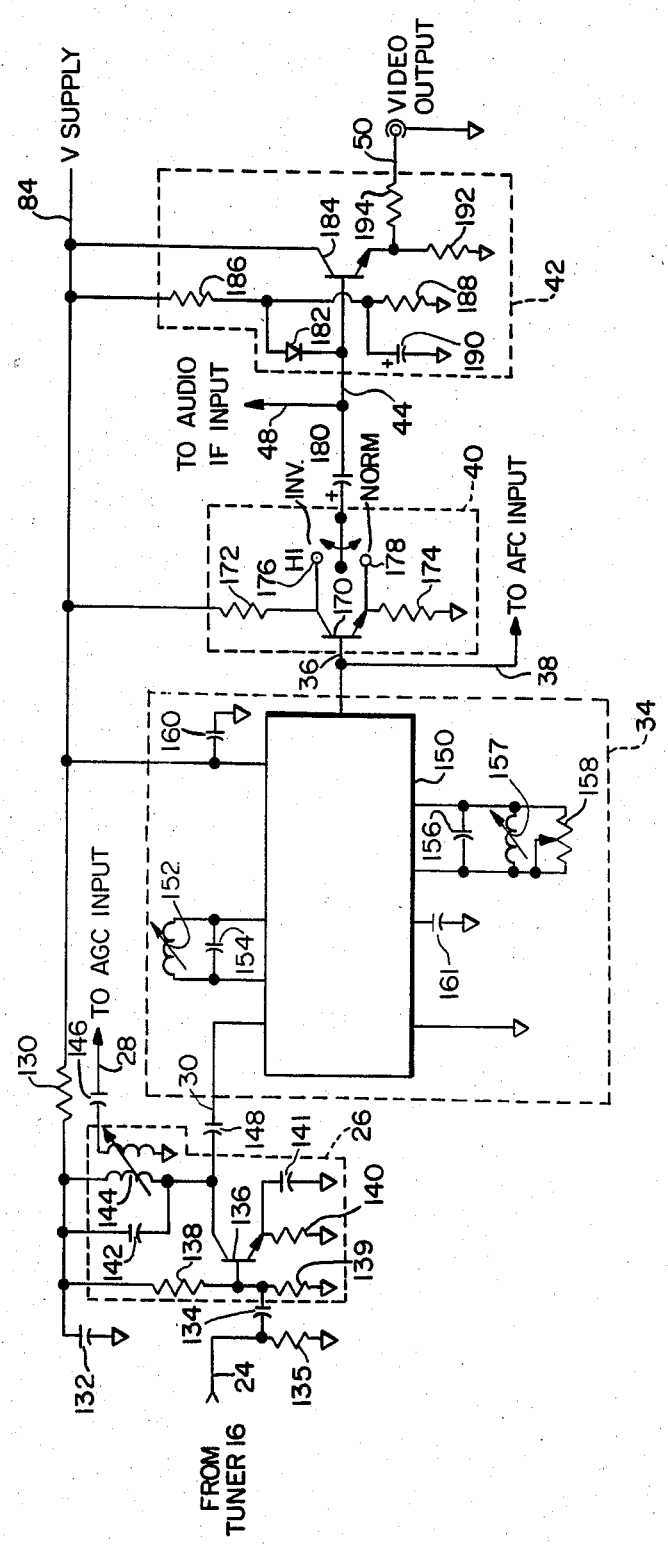
FIG. 4 is a schematic illustrating the intermediate frequency amplifier, the video intermediate frequency amplifier and detector, the video inverter, and the video driver.

FIG. 4 illustrates, in schematic form, several funcional units illustrated in FIG. 1. Intermediate frequency amplifier 26, video intermediate frequency amplifier and detector 34, video inverter 40, and video driver 42 are designated by dashed lines. Power supply decoupling is provided by resistor 130 and capacitor 132 tied to supply line 84. One side of capacitor 132 is connected to ground. Line 24 from tuner 16 is coupled to capacitor 134 and resistor 135. Capacitor 134 provides capacitive coupling to preserve the bypass characteristics of tuner 16.

Intermediate frequency amplifier 26 ultimately receives an intermediate frequency composite signal from tuner 16. Intermediate frequency amplifier 26 includes an RC biased class AB amplifier. Amplifer 26 includes transistor 136, a voltage divider network including resistors 138 and 139, and an RC network including resistor 140 and capacitor 141. The emitter of transistor 136 is tied to one side of both resistor 140 and capacitor 141 and the collector of transistor 136 is tied to a resonant circuit including capacitor 142 and coil 144. The resonant circuit maintains the bypass characteristics of intermediate frequency amplifier 26. The base of transistor 136 is coupled to coupling capacitor 134, resistor 138 and resistor 139. A capacitor 146 allows an AC signal from coil 144 to pass onto line 28 to the AGC input of AGC detector 32. A coupling capacitor 148 couples the collector of transistor 136 to the input line 30 of video intermediate frequency amplifier and detector 34.

In one embodiment, video intermediate frequency amplifier and detector 34 primarily includes an integrated circuit chip 150 which provides a high gain amplifier, a limiter and a discriminator for the amplified intermediate frequency composite signal supplied via line 30 by amplifier 26. In one embodiment, chip 150 is a LM1821S, manufactured by National Semiconductor. A tank circuit including coil 152 and capacitor 154 provides limiter tuning to chip 150. Another tank circuit including capacitor 156, coil 157 and variable resistor 158 provides discriminator tuning for chip 150. Variable resistor 158 is adjusted to establish the Q of the discriminator circuitry within chip 150. In this particular embodiment, pin 4 is connected to line 30, pins 1 and 2 are connected across capacitor 154, pins 6 and 7 are tied together, and pin 8 is coupled to supply line 84. A bypass capacitor 160 is coupled between ground and line 84 to maintain a stable source of power to chip 150. A capacitor 161 is connected between pin 14 and ground as a signal bypass capacitor for an active portion of the circuitry in chip 150. Pins 3 and 13 are coupled to ground and pins 15 and 16 are coupled across capacitor 156. The output of chip 150 is coupled via pin 12 to line 36 and ultimately to the input of video inverter 40. Also, the output of chip 150 is tied to line 38 and to the AFC input.

Inverter 40 includes a transistor 170. The base of transistor 170 is coupled to line 36. The collector of transistor 170 is tied to supply line 84 via resistor 172. The emitter of transistor 170 is coupled to ground across resistor 174. Switch H1 has two positions. Terminal 176 provides an inverted amplitude modulated video signal and terminal 178 provides a normal amplitude modulated video signal. As illustrated in FIG. 4, switch H1 is at an intermediate position between terminal 176 and 178. It is to be understood that switch H1 is an internal switch and can only be positioned in one of two positions, either inverted or normal, thereby coupling either the collector or the emitter of transistor 170 to the output of inverter 40.

Capacitor 180 and diode 182 provide a clamping circuit such that the voltage on line 44 will not go below a certain DC level. In a sense, capacitor 180 and diode 182 are a DC level restoration circuit. Line 48 is coupled to the audio intermediate frequency amplifier input and line 44 is coupled to the input of video driver 42. Video driver 42 includes transistor 184 which has a voltage established by a voltage divider network including resistor 186, resistor 188, and capacitor 190. Capacitor 190 ensures that only DC voltage is applied to the base of transistor 184. Resistor 192 and resistor 194 are coupled to the emitter of transistor 184. Resistor 192 provides a bias for transistor 184 and resistor 194 establishes a 75 ohm impedance level on output line 50.

Figure 5:
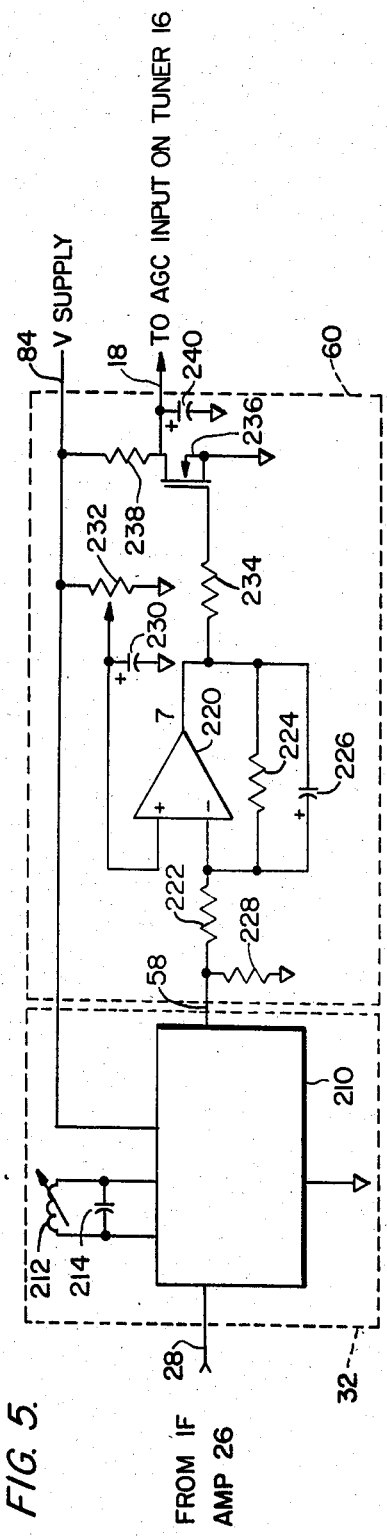
FIG. 5 is a schematic showing the automatic gain control detector and amplifier.

FIG. 5 illustrates, in schematic form, the automatic gain control (AGC) detector 32 and AGC amplifier 60 which are functionally illustrated in FIG. 1. AGC detector 32 primarily includes an AGC amplifier/detector integrated circuit chip 210. In one embodiment, chip 210 is an MC1330A2P, manufactured Motorola Corporation. The center frequency of chip 210 is established by a resonant circuit including coil 212 and capacitor 214. This resonant circuit should resonate at the center frequency of the FM discriminator. The resultant DC voltage output from chip 210 and applied to line 58 approaches zero with strong signals applied at the input line 28. In this embodiment, line 28 is coupled to pin 7, the resonant circuit is coupled across pins 2 and 3, supply line 84 is coupled to pins 5 and 6, pin 8 is coupled to ground and pin 4 is coupled to line 58.

AGC amplifier 60 includes an operational amplifier 220. The gain of operational amplifier 220 is established by a resistor 222 and a resistor 224. The time constant for operational amplifier 220 is established by resistor 224 and a parallelly connected capacitor 226. A resistor 228, connected between line 58 and ground, establishes a voltage reference for operational amplifier 220. Capacitor 230 and variable resistor 232 coupled between supply line 84 and ground, and also coupled to operational amplifier 220 establish a reference voltage for that operational amplifier. Variable resistor 232 allows that reference voltage to be adjusted accordingly. A resistor 234 couples the output of operational amplifier 220 to a vertical field effect transistor 236. A resistor 238 establishes a voltage bias for transistor 236 by coupling the supply line 84 to that transistor. A coupling capacitor 240 ensures that only a DC voltage is applied via line 16 to the AGC input on tuner 18.

Figure 6:
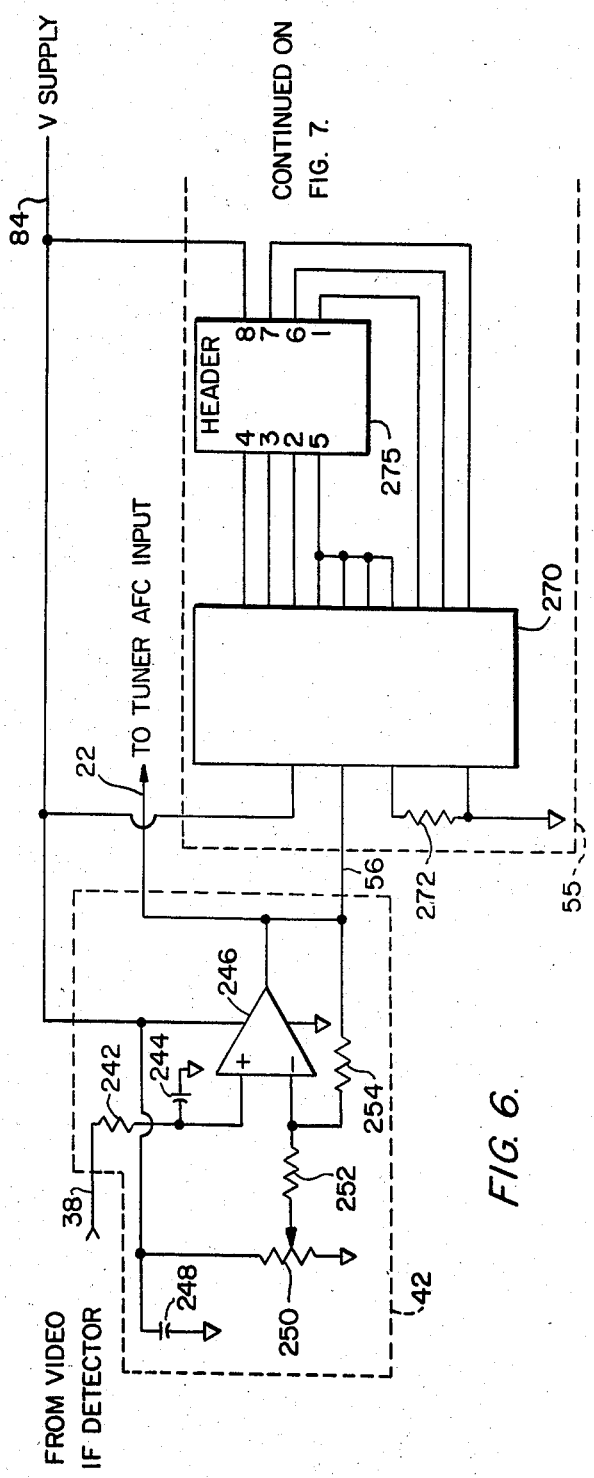
FIG. 6 is a schematic showing the automatic frequency control amplifier and an LED driver.

FIG. 6 illustrates, in schematic form, the automatic frequency control (AFC) amplifier and filter 42. Line 38 provides a signal from video intermediate frequency amplifier and detector 34, and particularly from the output of chip 150 as described with respect to FIG. 4. Resistor 242 and capacitor 244 filter the video signal on line 38 to establish a DC level that is proportional to the position the signal has on the S-curve. The filter including resistor 242 and capacitor 244 is coupled to an operational amplifier 246. Supply line 84 is also coupled to operational amplifier 246 and a bypass capacitor 248 is coupled between ground and supply line 84. A variable resistor 250 establishes a reference voltage for operational amplifier 246 and a resistor 252 and another resistor 254 establish the gain for the operational amplifier. The output of the operational amplifier is coupled to line 22 which ultimately leads to tuner 16.

LED display 55 is coupled to the output of AFC amplifier and filter 42 by line 56. A dot decoder driver integrated circuit chip 270 is tied to supply line 84 and to line 56 which carries a DC level that is proportional to the position of the video signal as on the S-curve. In one embodiment, chip 270 is a LM3914, manufactured by National Semiconductor. In that embodiment, a resistor 272 sets the current level for the light emitting diodes (LEDs) and hence sets the intensity of the LEDs. In that embodiment, pins 3 and 6 are coupled to supply line 84. Pin 5 is coupled to line 56, one side of resistor 272 is coupled to pin 7 and the other side of that resistor is coupled to pin 8. Pins 2 and 4 are coupled to ground as is pin 8. The center four levels of the dot decoder driver IC chip 270 are used to drive the center LED which is ultimately coupled to pin 5 of header 275. Hence, in this embodiment, pins 13, 14, 15 and 16 are coupled together and coupled to pin 5 of header 275. Pin 1 is coupled to pin 4 of the header, pin 18 is coupled to pin 3 of the header, pin 17 is coupled to pin 2, pin 12 is coupled to pin 1, pin 11 is coupled to pin 6, pin 10 is coupled to pin 7, and pin 8 is coupled to supply line 84 to indicate whether the FM receiver 10 is activated by switch 74 of FIG. 3. Header 275 is a simple mechanical connection and that header relates to the pin configuration as shown in FIG. 7.

Figure 7:
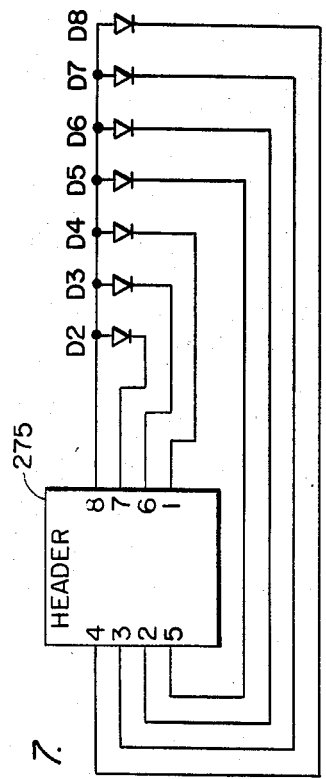
FIG. 7 schematically illustrates the connector and LED display.

FIG. 7 illustrates, in schematic form, the various LEDs and header 275. The diodes labelled D2, D3, D4, D5, D6, D7 and D8 are light emitting diodes (LEDs).

Figure 8:
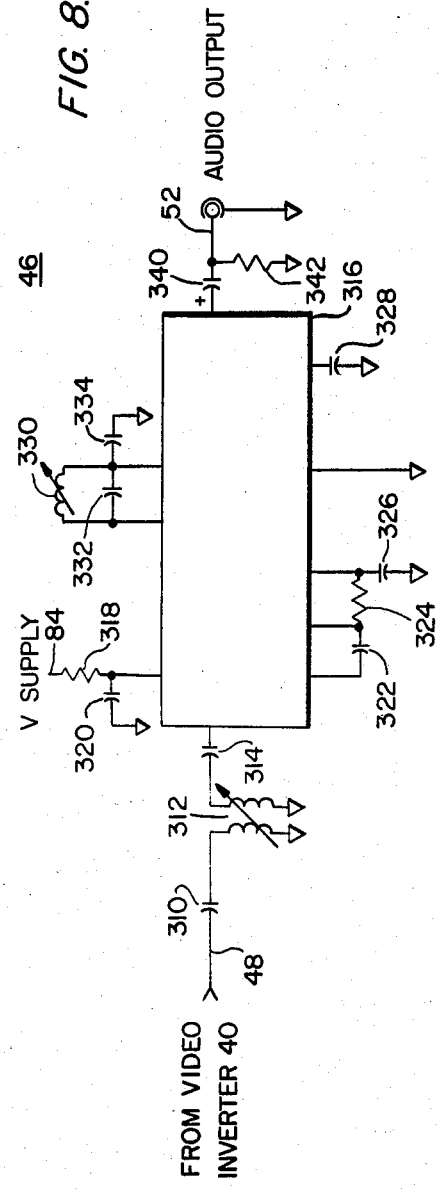
FIG. 8 schematically illustrates the audio intermediate frequency amplifier and discriminator.

FIG. 8 illustrates, in schematic form, audio intermediate frequency amplifier and discriminator 46. Line 48 supplies a signal from the output of video inverter 40 to the input of device 46 by a resonant circuit which includes capacitor 310 and coil 312. The resonant circuit passes, in one embodiment, a 5.5 megahertz sound component signal to the balance of device 46. Coupling capacitor 314 couples the output of the resonant circuit to the input of the amplifier/limiter/discriminator integrated circuit chip 316. In one embodiment, chip 316 is a MC1358P, manufactured by Motorola Corporation. Resistor 318 and capacitor 320 provide a decoupling network between supply line 84 and chip 316. Capacitor 322 ties the amplification stage of chip 316 to the limiter stage. Resistor 324 and capacitor 326 allow the differential input stage of chip 316 to remain properly biased while keeping pin 1, in this particular embodiment, at an RF ground potential. In this embodiment, pin 14 is the input for chip 316, pin 12 and pin 2 are coupled across capacitor 322 and pin 2 and pin 1 are coupled across resistor 324. Pins 3, 4 and 6 are tied to ground and pin 7 is tied to ground across capacitor 328 which provides for de-emphasis of the detected audio. FM detection is provided by a tuned circuit including coil 330, and capacitor 332. Capacitor 332 is tied across pins 9 and 10. Capacitor 334 provides phase delay for the detector stage in this particular embodiment. A coupling capacitor 340 is tied to pin 8 and the other side of capacitor 340 is tied to resistor 342 and line 52. Line 52 carries the audio output for FM video receiver 10. Resistor 342 provides for an output resistance of about 600 ohms.

The operation of FM video receiver 10 basically includes selecting an FM composite video signal, limiting and detecting the video portion of the composite signal, amplifying that video portion, isolating the audio portion from the composite video signal, limiting and detecting and further amplifying the audio signal. Tuner 16 receives a plurality of FM composite video signals. The user adjusts variable resistor 112, associated with tuning voltage regulator 54, to select a particular FM composite video signal from the plurality of video signals. The tuner includes an amplifying means for amplifying the selected FM composite video signal. As used herein, the phrase "composite video signal" include that signal having both visual information and audio or sound information. Tuner 16 also includes means for generating an intermediate frequency composite signal. A person of ordinary skill in the art recognizes that tuner 16 includes an oscilator and a mixer to create the lower intermediate frequency signal from the high frequency FM composite video signal from the antenna. The intermediate frequency composite signal carries the same intelligence as the amplified selected FM composite video signal. The tuner applies the intermediate frequency composite video signal on line 24.

The intermediate frequency composite video signal is amplified by intermediate frequency amplifier 26. The output of amplifier 26 is tied via line 30 to the input of video intermediate frequency amplifier and detector 34. Device 34 includes means for limiting and discriminating the amplified intermediate frequency composite signal. The limiting circuitry in chip 150 is tuned by the tank circuit including coil 152 and capacitor 154. The discriminator circuitry of chip 150 is tuned by the tank circuit including capacitor 156, coil 157, and variable resistor 158. Both the limiter and the discriminator circuits are tuned to the video portion of the amplified intermediate frequency composite signal supplied to the input of chip 150. The discriminator tuning tank circuit can be adjusted by changing variable resistor 158 and expanding or contracting the bandwidth detected by that discriminator circuit. By changing the circuit Q by adjusting variable resistor 158, FM video receiver 10 can be used with different transmitter deviations, i.e., to demodulate a broader FM bandwidth.

The output of chip 150 is tied to the input of video inverter 40. Inverter 40 allows FM video receiver 10 to be used with systems that invert the FM composite video signal to avoid easy slope detection by standard, commercially available, consumer television receivers. As stated earlier, those commercially available, consumer television receivers detect amplitude modulated video composite signals. By placing the position of switch H1 at the inverted terminal 176, the video signal is inverted. At the output of chip 150, an amplitude modulated video signal is supplied to the amplitude of the frequency variation of the video portion of the amplified intermediate frequency composite signal. That signal is applied to line 30. The clamping circuit, which includes capacitor 180 and diode 182 maintains the DC level on line 44 above a certain reference value. Transistor 184 of video driver 142 provides a buffer between video output 50 and the amplitude modulated video signal on line 44. The sync tips of that amplitude modulated video signal on line 50 are at or near ground potential and the signal on the output line is a line level video signal having about one volt peak to peak and corresponding to National Television System Commission standards. The output on line 50 can be applied to a cathode ray device or other display device well known to persons of ordinary skill in the art.

The audio intermediate frequency amplifier and discriminator 46 receives a signal via line 48 from the output of chip 150 via inverter 40. The audio portion of the originally received FM composite video signal is carried through substantially uneffected by device 34, the video intermediate frequency amplifier and detector. Hence, amplifier and discriminator 46 first separates the audio portion from the amplitude modulated video signal on line 44 of FIG. 4, and limits and discriminates or detects the FM component of that audio signal. A person of ordinary skill in the art recognizes that normal composite video signals include amplitude modulated video signals and frequency modulated audio signals. Hence, FM video receiver 10 must extract the audio signal and then limit and detect that FM component of the audio signal to provide an amplitude modulated audio signal on line 52. Since the audio portion of the composite video signal is substantially unchanged during processing by chip 150, chip 316 generates an amplitude modulated audio signal corresponding to the amplitude of the frequency variation of the audio portion of the amplified intermediate frequency composite signal. In one embodiment, the audio component of the composite signal is at 5.5 MHz. The audio component is passed to the audio intermediate frequency stage of chip 316 by resonant circuit including capacitor 310 and coil 312. Amplification, limitation, detection and/or discrimination of FM signals is known to a person of ordinary skill in the art. However, the device described and disclosed herein demodulates, amplifies, and detects an FM video composite signal rather than processes an AM video composite signal.

The automatic gain control (AGC) circuitry, schematically illustrated in FIG. 5, receives the amplified intermediate frequency composite signal via line 28. The amplifier/detector integrated circuit chip 210 has a center frequency established by the circuit including coil 212 and capacitor 214. This resonant circuit operates at a center frequency of the FM discriminator portion of video intermediate frequency amplifier and detector 34. When strong signals are received by the tuner, the output signal from chip 210 approaches 0 volts. The output signal on line 58 is a DC voltage. Hence, operational amplifier 220 amplifies only the DC voltage on line 58. If the received signal drops below the level set by variable resistor 232, transistor 236 is driven into conduction to lower the AGC voltage applied to tuner 16. The lower the voltage on pin 3 of this particular tuner, the smaller the amplification provided by the tuner.

The automatic frequency control (AFC) accepts the amplitude modulated composite video signal from line 38 at the output of chip 150. The signal on line 38 is filtered by resistor 242 and capacitor 244 to establish a DC level at the input of operational amplifier 246 which is proportional to the position of the received signal on the S-curve. This DC proportional signal is amplified by operational amplifier 246 and applied to the AFC pin on tuner 16. Hence, when the selected frequency is substantially similar to the frequency of the FM composite video signal received by tuner 16, the center LED, tied to pin 5 of header 275, lights up. The four center outputs of decoder LED driver integrated circuit chip 270 are tied together because the signal is within proper tuning range if any of the four center outputs of chip 270 are activated.

Thus, an FM video receiver is described and disclosed herein. The claims appended hereto are meant to cover all modifications readily apparent to those of ordinary skill in the art.

We claim:

1. An FM video receiver supplied with a plurality of frequency modulated (FM) composite video signals by an antenna comprising:

an ultra high frequency tuner having an antenna signal input, an automatic gain control (AGC) signal input and an automatic frequency control (AFC) signal input, said antenna signal input capable of receiving said plurality of FM composite video signals and said tuner including means for selecting one of said plurality of FM composite video signals, said tuner including an amplifying means for amplifying said selected FM composite video signal, said tuner including means for generating an intermediate frequency composite signal carrying the same intelligence as the amplified selected FM composite video signal at a frequency lower than said selected FM composite video signal, said tuner applying said intermediate frequency composite video signal on a corresponding output;

an intermediate frequency amplifier having an input coupled to said output of said tuner, said intermediate frequency amplifier amplifying said intermediate frequency composite signal and applying the amplified intermediate frequency composite signal to a corresponding output;

means for limiting and discriminating said amplified intermediate frequency composite signal, said means for limiting and discriminating tuned to the video portion of said amplified intermediate frequency composite signal and generating an amplitude modulated video signal corresponding to the amplitude of the frequency variation of the video portion of said amplified intermediate frequency composite signal, said amplitude modulated video signal being applied to an output of said means for limiting and discriminating;

a video driver coupled to said output of said means for limiting and discriminating, said video driver amplifying said amplitude modulated video signal to generate a line level video signal at a corresponding output;

an automatic gain control (AGC) means coupled said output of said intermediate frequency amplifier, said AGC means providing a feedback signal to said AGC signal input of said tuner to affect the tuner amplifying means and to stabilize said intermediate frequency composite signal;

an automatic frequency control (AFC) means coupled to said output of said means for limiting and discriminating, said AFC means providing a feedback signal to said AFC signal input of said tuner to affect said means for selecting one of said plurality of FM composite video signals; and an audio intermediate frequency amplifier coupled to said output of said means for limiting and discriminating, said audio amplifier including means for separating the audio portion from said amplitude modulated video signal, and including an audio limiter and discriminator means, said audio amplifier generating an amplitude modulated audio signal corresponding to the amplitude of the frequency variation of the audio portion of said amplified intermediate frequency composite signal and applying said amplitude modulated audio signal to a corresponding output.

2. An FM video receiver as in claim 1 including an inverter means coupled between said output of said means for limiting and discriminating and both the input of said video driver and the input of said audio intermediate frequency amplifier.

* * * * *